(12) United States Patent
Im

(10) Patent No.: US 9,093,174 B2
(45) Date of Patent: Jul. 28, 2015

(54) REFRESH CONTROL CIRCUIT OF SEMICONDUCTOR APPARATUS

(71) Applicant: SK hynix Inc., Icheon-si Gyeonggi-do (KR)

(72) Inventor: Jong Man Im, Icheon-si (KR)

(73) Assignee: Sk Hynix Inc., Gyeonggi-do (KR)

( * ) Notice: Subject to any disclaimer, the term of this patent is extended or adjusted under 35 U.S.C. 154(b) by 287 days.

(21) Appl. No.: 13/724,597

(22) Filed: Dec. 21, 2012

(65) Prior Publication Data

US 2014/0126311 A1  May 8, 2014

(30) Foreign Application Priority Data

Nov. 7, 2012 (KR) .................. 10-2012-0125570

(51) Int. Cl.
*G11C 7/00* (2006.01)
*G11C 11/406* (2006.01)
*G11C 11/4094* (2006.01)
*G11C 7/22* (2006.01)

(52) U.S. Cl.
CPC ...... *G11C 11/40611* (2013.01); *G11C 11/4094* (2013.01); *G11C 11/40618* (2013.01); *G11C 7/222* (2013.01); *G11C 2211/4065* (2013.01)

(58) Field of Classification Search
USPC ........................... 365/194, 193, 191, 189.05
See application file for complete search history.

(56) References Cited

U.S. PATENT DOCUMENTS

| | | | |
|---|---|---|---|
| 6,937,530 B2 * | 8/2005 | Bell ......................... | 365/189.02 |
| 7,321,525 B2 * | 1/2008 | Matsui ..................... | 365/233.12 |
| 8,194,488 B2 * | 6/2012 | Han ............................. | 365/222 |
| 8,330,512 B2 * | 12/2012 | Kim et al. .................... | 327/158 |
| 2011/0176372 A1 * | 7/2011 | Baba et al. ............... | 365/189.05 |

FOREIGN PATENT DOCUMENTS

KR   1020100030868 A   3/2010

* cited by examiner

*Primary Examiner* — Pho M Luu
(74) *Attorney, Agent, or Firm* — William Park & Associates Ltd.

(57) ABSTRACT

A refresh control circuit of a semiconductor apparatus includes a variable delay unit configured to delay a signal that is activated quickest among a plurality of row address strobe signals activated at a predetermined time interval by a predetermined time, and to generate a preliminary pulse signal, and a piled delay unit configured to delay the preliminary pulse signal by various times, and to generate a plurality of refresh period pulse signals that are sequentially activated.

9 Claims, 3 Drawing Sheets

REFRESH CONTROL CIRCUIT OF SEMICONDUCTOR APPARATUS

CROSS-REFERENCES TO RELATED APPLICATION

The present application claims priority under 35 U.S.C. §119(a) to Korean application number 10-2012-0125570, filed on Nov. 7, 2012, in the Korean Intellectual Property Office, which is incorporated herein by reference in its entirety.

BACKGROUND

1. Technical Field

The present invention relates generally to a semiconductor apparatus, and more particularly, to a refresh control circuit of a semiconductor apparatus.

2. Related Art

As illustrated in FIG. 1, a refresh control circuit 1 of a semiconductor apparatus according to the conventional art includes a piled delay unit 10, a delay unit 20, first to fourth variable delay units 30, 40, 50, and 60, and a precharge control unit 70.

The piled delay unit 10 generates a plurality of row active signals RACT<0:7> in response to a refresh signal REF and a refresh mode signal RMODE.

The plurality of row active signals RACT<0:7> may then be activated at a predetermined time interval according to the refresh mode signal RMODE.

The delay unit 20 delays the plurality of row active signals RACT<0:7> by a predetermined time and generates a plurality of row address strobe signals IRAS<0:7>.

The delay unit 20 includes a plurality of delays 21 to 28.

The plurality of variable delay units 30, 40, 50, and 60 delay the plurality of row address strobe signals IRAS<0:7> by a delay time determined by the refresh mode signal RMODE, and generate a plurality of refresh period pulse signals RE<0:3>.

The variable delay unit 30 delays a signal, which is obtained by logically operating (for example, ORing) the row address strobe signals IRAS<0, 7> by the delay time determined by the refresh mode signal RMODE, and generates a refresh period pulse signal RE<0>.

The variable delay unit 40 delays a signal, which is obtained by logically operating (for example, ORing) the row address strobe signals IRAS<3, 4> by the delay time determined by the refresh mode signal RMODE, and generates a refresh period pulse signal RE<1>.

The variable delay unit 50 delays a signal, which is obtained by logically operating (for example, ORing) the row address strobe signals IRAS<2, 5> by the delay time determined by the refresh mode signal RMODE, and generates a refresh period pulse signal RE<2>.

The variable delay unit 60 delays a signal, which is obtained by logically operating (for example, ORing) the row address strobe signals IRAS<1, 6> by the delay time determined by the refresh mode signal RMODE, and generates a refresh period pulse signal RE<3>.

The precharge control unit 70 controls the piled delay unit 10 in response to the plurality of refresh period pulse signals RE<0:3>, and deactivates the plurality of row active signals RACT<0:7>.

FIG. 1 illustrates an example in which the semiconductor apparatus includes first to eight memory banks BK0 to BK7 (not shown), and supports a 4 piled operation. Memory banks with the same order are refreshed for a period in which the plurality of row active signals RACT<0:7> are activated.

The 4 piled operation then indicates a refresh scheme in which four row active signal groups RACT<0, 7>, RACT<3, 4>, RACT<2, 5>, and RACT<1, 6> are activated at a predetermined time interval.

The conventional art includes a plurality of variable delay units, such as variable delay units 30, 40, 50, and 60, such that the 4 piled operation is supported.

However, the four variable delay units 30, 40, 50, and 60 attribute to an increase in circuit area of the refresh control circuit, resulting in a reduction of a layout margin of the semiconductor apparatus. Accordingly, when supporting a piled operation beyond the 4 piled operation such as an 8 piled operation, eight variable delay units are required, resulting in a significant increase in circuit area.

SUMMARY

A refresh control circuit of a semiconductor apparatus capable of reducing circuit area is described herein.

In an embodiment of the present invention, a refresh control circuit of a semiconductor apparatus includes: a variable delay unit configured to delay a signal that is activated quickest among a plurality of row address strobe signals activated at a predetermined time interval by a predetermined time and to generate a preliminary pulse signal, and a piled delay unit configured to delay the preliminary pulse signal by various times and to generate a plurality of refresh period pulse signals that are sequentially activated.

In another embodiment of the present invention, a refresh control circuit of a semiconductor apparatus includes: a first piled delay unit configured to generate a plurality of row active signals that are sequentially activated at a predetermined time interval in response to a refresh signal, a delay unit configured to delay the plurality of row active signals and generate a plurality of row address strobe signals, a variable delay unit configured to delay a signal that is activated quickest among the plurality of row address strobe signals by a predetermined time, and to generate a preliminary pulse signal; and a second piled delay unit configured to delay the preliminary pulse signal by various times and to generate a plurality of refresh period pulse signals that are sequentially activated.

According to the refresh control circuit of the semiconductor apparatus in the present invention, an area of a delay circuit of the refresh control circuit may be minimized in order to improve a layout margin of the semiconductor apparatus.

BRIEF DESCRIPTION OF THE DRAWINGS

Features, aspects, and embodiments are described in conjunction with the attached drawings, in which.

DETAILED DESCRIPTION

Hereinafter, a refresh control circuit of a semiconductor apparatus according to the present invention will be described in detail with reference to the accompanying drawings through various embodiments.

A semiconductor apparatus includes a memory area for storing data.

A memory bank BK may be used as a unit for dividing the memory area.

Embodiments of the present invention corresponds to a refresh control circuit 100 when a semiconductor apparatus includes first to eight memory banks BK0 to BK7 (not illustrated) as an example for convenience of description. However, the present invention is not limited to eight memory banks.

Figure 1:
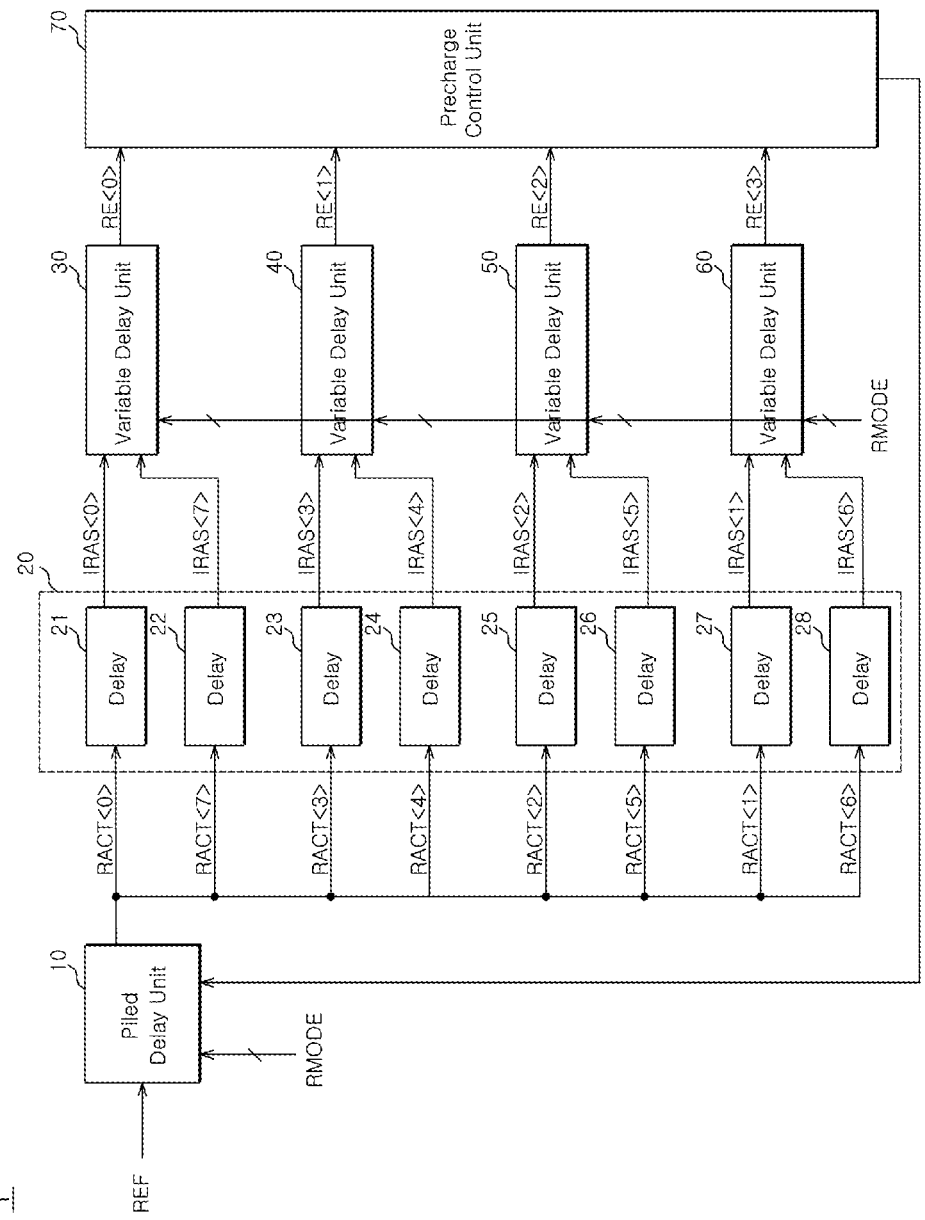
FIG. 1 is a block diagram of a refresh control circuit 1 of a semiconductor apparatus according to the conventional art.
Figure 2:
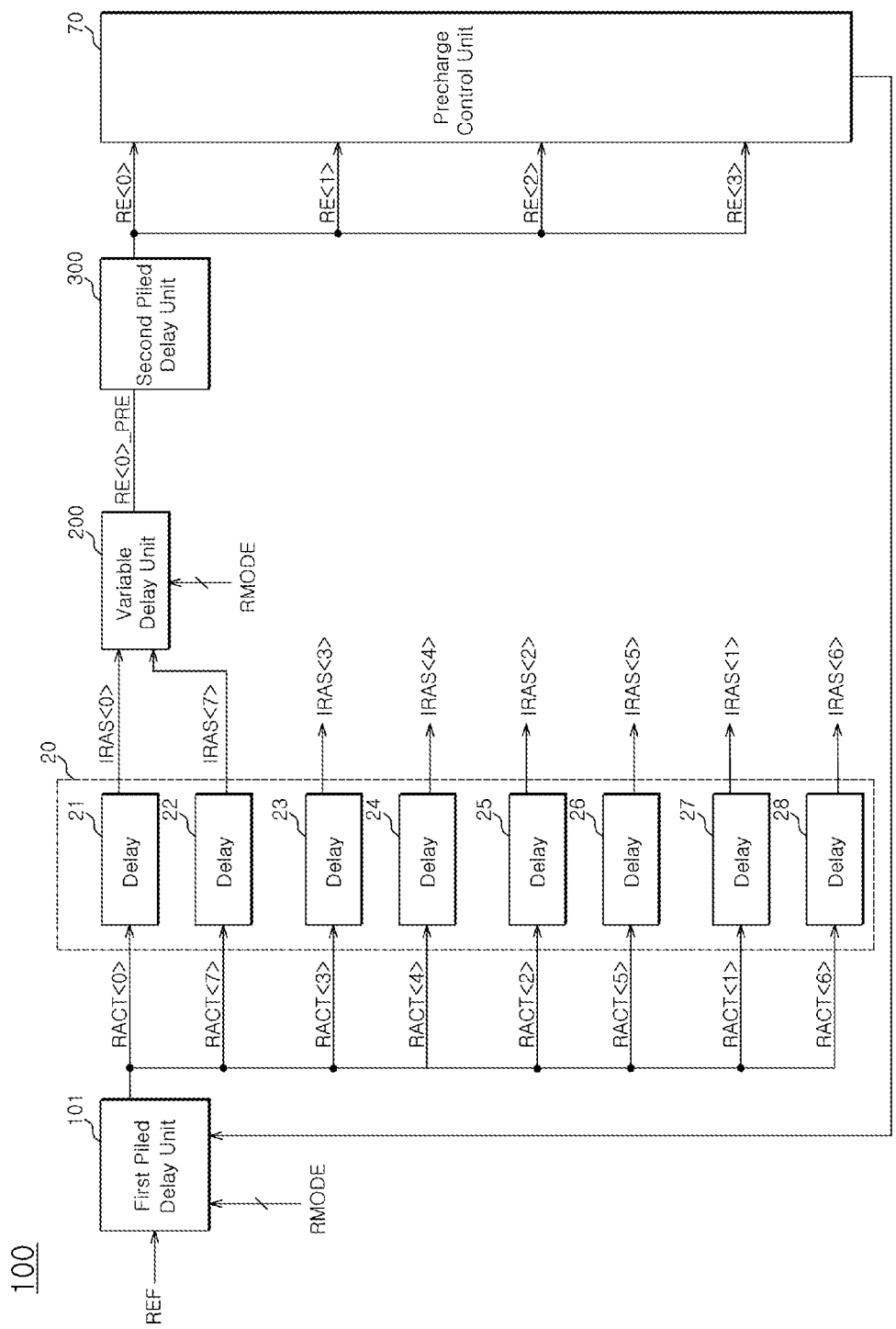
FIG. 2 is a block diagram of a refresh control circuit 100 of a semiconductor apparatus according to an embodiment of the present invention.

FIG. 2 is a block diagram of a refresh control circuit 100 of a semiconductor apparatus according to an embodiment of the present invention.

As illustrated in FIG. 2, the refresh control circuit 100 includes a first piled delay unit 101, a delay unit 20, a variable delay unit 200, a second piled delay unit 300, and a precharge control unit 70.

The first piled delay unit 101 is configured to generate a plurality of row active signals RACT<0:7> in response to a refresh signal REF and a refresh mode signal RMODE.

The refresh mode signal RMODE is then used to define one of a plurality of refresh modes which will be described later, including a 4 piled+Hidden mode, a 4 piled mode, a 2 piled+Hidden mode, and a 2 piled mode.

When the refresh signal REF is inputted, the first piled delay unit 101 generates the plurality of row active signals RACT<0:7> that are sequentially activated at a time interval set in a refresh mode defined by the refresh mode signal RMODE among the various refresh modes including the 4 piled+Hidden mode, the 4 piled mode, the 2 piled+Hidden mode, and the 2 piled mode.

The delay unit 20 is configured to delay the plurality of row active signals RACT<0:7> by a predetermined time and generate a plurality of row address strobe signals IRAS<0:7>.

The delay unit 20 may include a plurality of delays 21 to 28.

The variable delay unit 200 is configured to delay a signal, which is obtained by logically operating (for example, ORing) signals activated quickest among the plurality of row address strobe signals IRAS<0:7>, such as the row address strobe signal IRAS<0> and the row address strobe signal IRAS<7>, by a delay time predetermined by the refresh mode signal RMODE, and to generate a preliminary pulse signal RE<0>_PRE.

The row address strobe signal IRAS<0> and the row address strobe signal IRAS<7> may then be activated at substantially similar times.

Consequently, it may be possible to provide a circuit for generating the preliminary pulse signal RE<0>_PRE by delaying only one of the row address strobe signal IRAS<0> and the row address strobe signal IRAS<7> through the variable delay unit 200.

However, in a specific operation state, only one of the row address strobe signal IRAS<0> and the row address strobe signal IRAS<7> may be activated.

Accordingly, an embodiment of the present invention corresponds to a circuit using a signal obtained by ORing the row address strobe signal IRAS<0> and the row address strobe signal IRAS<7> as an option for the specific operation state as an example for convenience of description.

The second piled delay unit 300 is configured to delay the preliminary pulse signal RE<0>_PRE by various times, and to generate a plurality of refresh period pulse signals RE<0:3> that are sequentially activated at a predetermined time interval.

The precharge control unit 70 is configured to control the first piled delay unit 101 in response to the plurality of refresh period pulse signals RE<0:3>, and to deactivate the plurality of row active signals RACT<0:7>.

Unit delay elements, which constitute the first piled delay unit 101, the delay unit 20, the variable delay unit 200, and the second piled delay unit 300 may then be configured to delay only a rising edge of an input signal.

Figure 3:
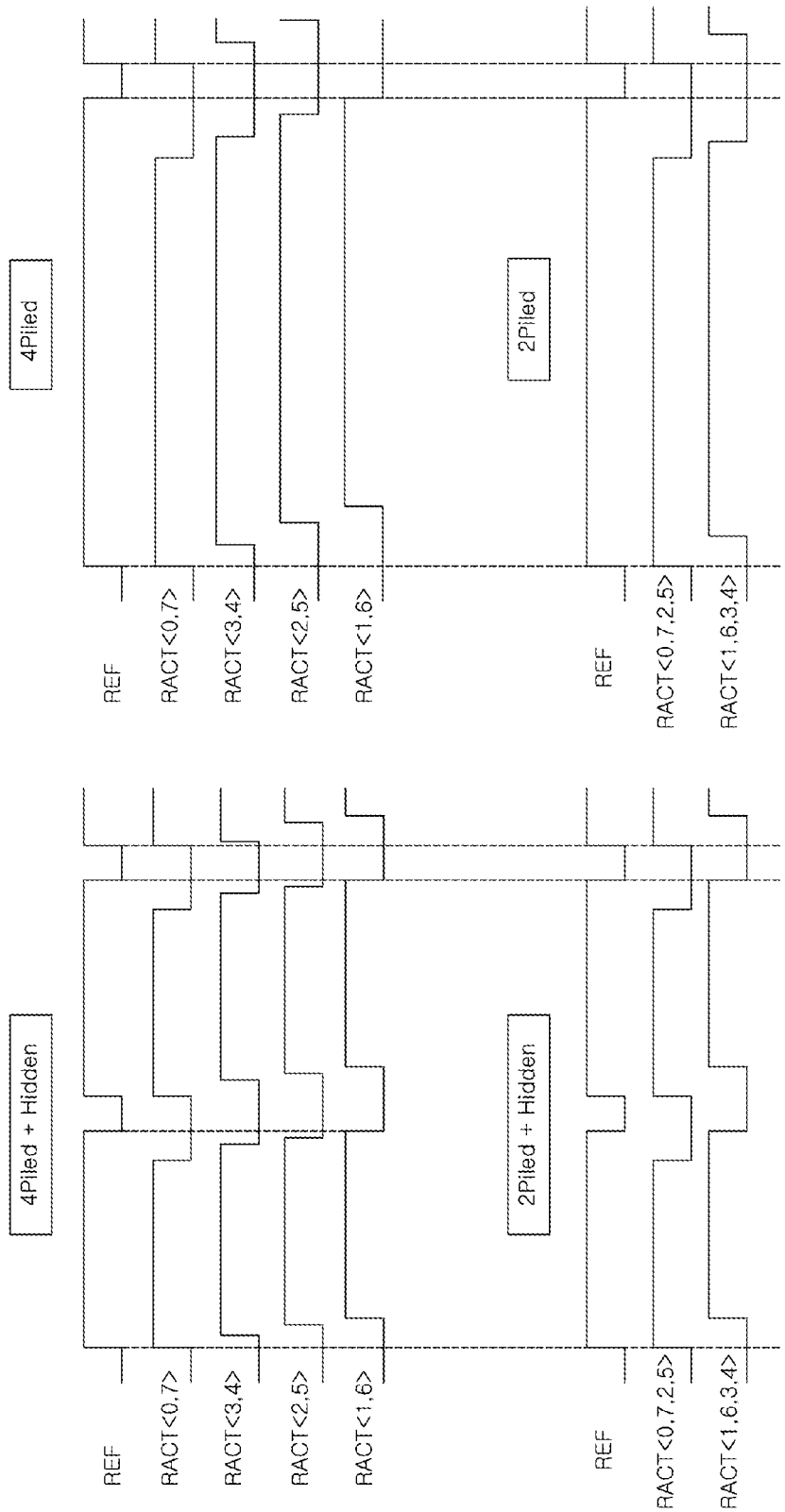
FIG. 3 is a timing diagram illustrating a refresh operation scheme of a refresh control circuit 100 of a semiconductor apparatus according to an embodiment of the present invention.

FIG. 3 is a timing diagram illustrating a refresh operation scheme of the refresh control circuit 100 of the semiconductor apparatus according to an embodiment of the present invention.

The refresh mode may comprise of various modes, including the 4 piled+Hidden mode, the 4 piled mode, the 2 piled+Hidden mode, and the 2 piled mode.

One of the 4 piled+Hidden mode, the 4 piled mode, the 2 piled+Hidden mode, and the 2 piled mode is selected and thus defined by the refresh mode signal RMODE at a given time.

Piled modes then indicate a refresh scheme of grouping a predetermined number of signal bits among the plurality of row active signals RACT<0:7>, and activating each group at a predetermined time interval.

Hidden modes indicate a refresh scheme of performing a refresh operation twice for a predetermined refresh period. That is, externally, a refresh period for a one-time refresh operation is set. However, internally, the refresh signal REF controls activation periods to be provided twice, and a refresh operation is performed twice in each activation period.

A refresh operation of an embodiment when the refresh mode signal RMODE defines the 4 piled+Hidden mode will be described below.

When the refresh signal REF is inputted, the first piled delay unit 101 activates four row active signal groups RACT<0, 7>, RACT<3, 4>, RACT<2, 5>, and RACT<1, 6> at a predetermined time interval such as 10 ns.

The variable delay unit 200 delays a signal that is obtained by ORing the row address strobe signal IRAS<0> and the row address strobe signal IRAS<7>, which are activated quickest among the plurality of row address strobe signals IRAS<0:7> by a predetermined delay time such as 80 ns, thereby generating the preliminary pulse signal RE<0>_PRE.

The second piled delay unit 300 delays the preliminary pulse signal RE<0>_PRE by various times, thereby generating the plurality of refresh period pulse signals RE<0:3> that are sequentially activated at a predetermined time interval.

The precharge control unit 70 controls the first piled delay unit 101 in response to the plurality of refresh period pulse signals RE<0:3>, thereby deactivating the plurality of row active signals RACT<0:7>.

A refresh operation is then performed for the first to eighth memory banks BK0 to BK7 (not illustrated) for activation periods of the plurality of row active signals RACT<0:7>.

A refresh operation of an embodiment when the refresh mode signal RMODE defines the 2 piled+Hidden mode will be described below.

When the refresh signal REF is inputted, the first piled delay unit 101 activates two row active signal groups RACT<0, 7, 2, 5> and RACT<3, 4, 1, 6> at a predetermined time interval such as 15 ns.

The variable delay unit 200 delays a signal that is obtained by ORing the row address strobe signal IRAS<0> and the row address strobe signal IRAS<7> of the row address strobe signals IRAS<0, 7, 2, 5>, which are quickly activated relative to the plurality of row address strobe signals IRAS<3, 4, 1, 6>, by a predetermined delay time such as 95 ns, thereby generating the preliminary pulse signal RE<0>_PRE.

The second piled delay unit 300 delays the preliminary pulse signal RE<0>_PRE by various times, thereby generating the plurality of refresh period pulse signals RE<0:3> that are sequentially activated at a predetermined time interval.

The precharge control unit 70 controls the first piled delay unit 101 in response to the plurality of refresh period pulse signals RE<0:3>, thereby deactivating the plurality of row active signals RACT<0:7>.

A refresh operation is then performed for the first to eighth memory banks BK0 to BK7 (not illustrated) for activation periods of the plurality of row active signals RACT<0:7>.

The row address strobe signal IRAS<0> and the row address strobe signal IRAS<7> are then activated at substantially similar times.

Consequently, it may be possible to generate the preliminary pulse signal RE<0>_PRE by delaying only one of the row address strobe signal IRAS<0> and the row address strobe signal IRAS<7> through the variable delay unit 200.

However, in a specific operation state, only one of the row address strobe signal IRAS<0> and the row address strobe signal IRAS<7> may be activated.

Accordingly, an embodiment corresponds to using a signal obtained by ORing the row address strobe signal IRAS<0> and the row address strobe signal IRAS<7> as an option for the specific operation state for example for convenience of description.

As a consequence, according to an embodiment, it is possible to generate the plurality of refresh period pulse signals RE<0:3> through only one variable delay unit 200, and to control a refresh operation.

In the case of a circuit that supports the 4 piled mode, it is possible to reduce circuit area due to the variable delay unit by approximately ¼ in comparison with the conventional art. In the case of a circuit that supports an 8 piled mode, it is possible to reduce circuit area due to the variable delay unit by approximately ⅛ in comparison with the conventional art.

While certain embodiments have been described above, it will be understood to those skilled in the art that the embodiments described are by way of example only. Accordingly, the refresh control circuit of the semiconductor apparatus described herein should not be limited based on the described embodiments. Rather, the refresh control circuit of the semiconductor apparatus described herein should only be limited in light of the claims that follow when taken in conjunction with the above description and accompanying drawings.

What is claimed is:

1. A refresh control circuit of a semiconductor apparatus comprising:
    a variable delay unit configured to generate a preliminary pulse signal by delaying a signal activated quickest among a plurality row address strobe signals activated at a predetermined time interval by a predetermined time, wherein the plurality row address strobe signals are parallel signals; and
    a piled delay unit configured to generate a plurality of refresh period pulse signals that are sequentially activated by delaying the preliminary pulse signal by various times, wherein the plurality of refresh period pulse signals are parallel signals.

2. The refresh control circuit of the semiconductor apparatus according to claim 1, wherein the variable delay unit is configured to change an activation time interval of the plurality row address strobe signals in response to a refresh mode signal that defines one of a plurality of refresh modes.

3. The refresh control circuit of the semiconductor apparatus according to claim 1, wherein the variable delay unit is configured to delay a signal that is obtained by logically operating signals of a group activated quickest among the plurality of row address strobe signals, and to generate the preliminary pulse signal.

4. A refresh control circuit of a semiconductor apparatus comprising:
    a first piled delay unit configured to generate a plurality of row active signals that are sequentially activated at a predetermined time interval in response to a refresh signal;
    a delay unit configured to delay the plurality of row active signals and generate a plurality of row address strobe signals;
    a variable delay unit configured to delay a signal that is activated quickest among the plurality of row address strobe signals by a predetermined time, and to generate a preliminary pulse signal; and
    a second piled delay unit configured to delay the preliminary pulse signal by various times, and to generate a plurality of refresh period pulse signals that are sequentially activated.

5. The refresh control circuit of the semiconductor apparatus according to claim 4, wherein the variable delay unit is configured to change the predetermined time in response to a refresh mode signal that defines one of a plurality of refresh modes.

6. The refresh control circuit of the semiconductor apparatus according to claim 5, wherein within the refresh mode, a piled mode is individually performed or both the piled mode and a hidden mode is performed,
    wherein the piled mode comprises the plurality of row active signals activating at the predetermined time interval, and
    wherein the hidden mode comprises activation periods of the plurality of row address strobe signals existing in a predetermined refresh period provided twice.

7. The refresh control circuit of the semiconductor apparatus according to claim 4, wherein the variable delay unit is configured to delay a signal that is obtained by logically operating signals of a group activated quickest among the plurality of row address strobe signals by the predetermined time, and to generate the preliminary pulse signal.

8. The refresh control circuit of the semiconductor apparatus according to claim 4, further comprising:
    a precharge control unit configured to deactivate the plurality of row active signals in response to the plurality of refresh period pulse signals, thereby controlling a precharge operation of the semiconductor apparatus.

9. The refresh control circuit of the semiconductor apparatus according to claim 4, wherein the first piled delay unit is configured to change the predetermined time interval in response to a refresh mode signal that defines one of a plurality of refresh modes.

* * * * *